United States Patent
Lam et al.

(10) Patent No.: US 9,837,736 B2
(45) Date of Patent: Dec. 5, 2017

(54) PRINTED CIRCUIT BOARD COMPRISING BLIND PRESS-FIT VIAS

(71) Applicant: Keysight Technologies, Inc., Minneapolis, MN (US)

(72) Inventors: Kuen Yew Lam, Selangor (MY); Thiam Ping Oon, Penang (MY); Jared Richard, Fort Collins, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 369 days.

(21) Appl. No.: 14/311,293

(22) Filed: Jun. 21, 2014

(65) Prior Publication Data

US 2015/0372403 A1     Dec. 24, 2015

(51) Int. Cl.
*H05K 7/00* (2006.01)
*H01R 12/58* (2011.01)
*H05K 1/11* (2006.01)
*H05K 7/14* (2006.01)
*H05K 1/16* (2006.01)

(52) U.S. Cl.
CPC ........... *H01R 12/585* (2013.01); *H05K 1/115* (2013.01); *H05K 7/1452* (2013.01); *H05K 1/162* (2013.01); *H05K 2201/044* (2013.01); *H05K 2201/09509* (2013.01); *H05K 2201/1059* (2013.01); *Y10T 29/49128* (2015.01); *Y10T 29/51* (2015.01); *Y10T 156/1057* (2015.01)

(58) Field of Classification Search
USPC .................. 361/783, 788; 174/251, 261, 262
See application file for complete search history.

(56) References Cited

U.S. PATENT DOCUMENTS

| | | | |
|---|---|---|---|
| 8,661,178 B2 | 2/2014 | Richard | |
| 8,756,360 B1* | 6/2014 | Richard | G06F 13/4022 710/316 |
| 2008/0145995 A1* | 6/2008 | Borland | H05K 1/162 438/381 |
| 2012/0243194 A1* | 9/2012 | Huang | H05K 7/00 361/774 |

FOREIGN PATENT DOCUMENTS

| | | |
|---|---|---|
| CN | 202676198 | 1/2013 |
| CN | 202771345 | 3/2013 |

OTHER PUBLICATIONS

Co-pending U.S. Appl. No. 13/247,482, filed Sep. 28, 2011.
Co-pending U.S. Appl. No. 13/910,743, filed Jun. 5, 2013.

* cited by examiner

Primary Examiner — Andargie M Aychillhum

(57) ABSTRACT

An apparatus comprises a printed circuit board (PCB) having a first surface and a second surface, a plurality of blind press-fit vias penetrating the first surface and extending partially through the PCB toward the second surface, the blind press-fit vias configured to receive press-fit connectors of at least one component to be connected to the PCB, and a plurality of electrical connectors disposed in a region of the second surface opposite the blind press-fit vias and configured to interface with one or more signal processing components disposed on the second surface.

11 Claims, 10 Drawing Sheets

PRINTED CIRCUIT BOARD COMPRISING BLIND PRESS-FIT VIAS

BACKGROUND

Peripheral component interconnect express (PCI-E) is a standard for incorporating peripheral devices in computing systems and other electronic apparatuses. The standard defines interfaces and protocols for communication with PCI-E compatible devices and is commonly used in consumer and industrial applications as a motherboard level interconnect, a backplane interconnect, and an expansion card interface.

PCI-E has also been adapted for various modular applications, such as external chassis used to connect numerous peripheral devices to a host system. These modular applications have achieved popularity because they provide system integrators with flexibility to connect various peripheral devices according to their specific needs.

In an effort to standardize certain aspects of modular PCI-E applications, committees have developed compact PCI express (cPCI-E), which is a ruggedized version of PCI-E that can be used to incorporate peripherals in an external chassis, and PCI-E eXtensions for instrumentation (PXI-E), which is a version of cPCI-E adapted for test and measurement equipment such as oscilloscopes, logic analyzers, and so on.

A cPCI-E or PXI-E chassis typically comprises a system slot configured to receive a system control module, a plurality of peripheral slots each configured to receive a peripheral module, and a PCI-E switch fabric connected between the system slot and the peripheral slots. The chassis can be implemented in a standalone configuration where the system control module comprises an embedded controller such as a personal computer (PC) chipset, or it can be implemented in a hosted configuration where the system control module is connected to a remote host via a PCI-E cabled interface. A cPCI-E or PXI-E chassis can also be expanded through the use of cabled PCI-E modules, which can be inserted into the slots of the chassis and connected to additional downstream chassis or modules. For example, a cabled PCI-E module can be used to connect a first chassis to a second downstream chassis in a daisy chained configuration.

FIG. 1 is a diagram illustrating an example of a PXI-E chassis. As illustrated in FIG. 1, a PXI-E chassis 100 comprises a physical support structure 115, a plurality of module slots 1 through 18 configured to receive various PCI-E compatible modules, a cavity 105 configured to house and cool an embedded controller, and a backplane 110 located at the back of cavity 105 and behind module slots 1 through 18. Among module slots 1 through 18, slot 1 is a system slot, slot 10 is a timing slot, and slots 2 through 18 are peripheral slots.

System slot 1 is designated to receive a system control module for controlling modules in each of the other slots. In general, the system control module can be an embedded controller or a cabled PCI-E interface module, such as a cabled target module or host module. In several embodiments described below, it is assumed that system slot 1 is occupied by a cabled target module connected to a remote host such as a PC. System slot 1 comprises a connector for power, another two connectors for PCI-E, and an instrument specific connector.

Timing slot 10 is designated to receive a timing module for generating timing and synchronization signals for the other slots. It comprises a connector for providing timing signals as well as connectivity as a PXI-E peripheral slot.

The remaining slots are designated to receive peripheral modules or cabled PCI-E interface modules, such as host modules or target modules. Peripheral slots 2-9 and 11-18 are all hybrid slots, with each one comprising a 32-bit PCI connector, a PCI-E connector, and a connector for instrument functions such as triggers and clocks. Timing slot 10 has special connectors dedicated to timing and synchronization functionality but can operate as a peripheral slot whether these resources are used or not.

The use of hybrid peripheral slots allows a user to insert either a PXI or a PXI-E module. A chassis that provides hybrid slots on all peripheral slots provides great flexibility for users to support a wide array of legacy PXI products available while providing the necessary upgrade path to higher performance PXI-E modules utilizing the latest PCI-E fabric technology.

Backplane 110, which typically comprises a printed circuit board (PCB), provides physical and logical support for module slots 1 through 18. For instance, as illustrated in FIG. 2, module slot 2 (and other module slots) can be physically mounted on backplane 110 bypress fitting associated slot connectors 210 into plated through hole vias (THVs) 205. Modules connected to module slots 1 through 18 can communicate with each other through a switch fabric, which is typically disposed on backplane 110, although it may alternatively be located, at least in part, on a mezzanine card connected to backplane 110.

Cavity 105 is located to the left of system slot 1 and has a size designed to accommodate an embedded controller connected to system slot 1. For instance, cavity 105 typically has a width large enough to accommodate a two-slot wide or four-slot wide embedded controller. In addition, cavity 105 typically has cooling facilities, such as a vertical airflow, configured to provide supplemental cooling for the embedded controller. For instance, cavity 105 may provide enough cooling for an embedded controller generating up to 140 watts of heat.

In general, a large number of electrical connectors may be required to support operations of PXI-E chassis 100. For instance, the number of electrical connectors required to implement all-hybrid slots in PXI-E chassis 100 may take up all available real estate on backplane 110. Under these circumstances, there may be inadequate space on backplane 110 to accommodate components such as a PCI-E switch integrated circuit (IC) implementing the PCI-E switch fabric.

One way to address the problem of inadequate space on backplane 110, as illustrated FIGS. 3 and 4, is to place certain components on another PGB in the form of a mezzanine board 305, and then connect mezzanine board 305 to backplane 110 with board-to-board connectors 310. A significant shortcoming of this approach, however, is that it requires an increase in the size of backplane 110 to accommodate the board-to-board connectors 310, which tends to decrease airflow through PXI-E chassis 100, as shown in FIG. 4. In the example of FIG. 4, the flow of air from a module in module slot 2 to an exhaust fan 410 is restricted as the edges of backplane 110 get closer to the walls of physical support structure 115. This may produce a need for higher fan speed, increasing acoustic noise, among other things.

Another way to address the problem of inadequate space on backplane 110, as illustrated by a PXI-E chassis 100' in FIG. 5, is to remove some of module slots 1 through 18 to accommodate PCI-E switching components 505. A significant shortcoming of this approach, however, is that it decreases the available functionality of PXI-E chassis 100.

In view of at least the above shortcomings of conventional PCI-E compatible chassis, there is a general need for improved approaches to backplane design and/or placement of electrical connectors.

SUMMARY

In accordance with a representative embodiment, an apparatus comprises a PCB having a first surface and a second surface, a plurality of blind press-fit vias penetrating the first surface and extending partially through the PCB toward the second surface, the blind press-fit vias configured to receive press-fit connectors of at least one component to be connected to the PCB, and a plurality of electrical connectors disposed in a region of the second surface opposite the blind press-fit vias and configured to interface with one or more signal processing components disposed on the second surface.

In another representative embodiment, a method of manufacturing an apparatus comprises laminating first and second PCB components, each constituting a separate planar structure, forming plated through hole vias through the first PCB component, forming electrical connectors in the second PCB component, and laminating the first PCB component to the second PCB component such that the press-fit through hole vias form blind press-fit vias disposed opposite the electrical connectors.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
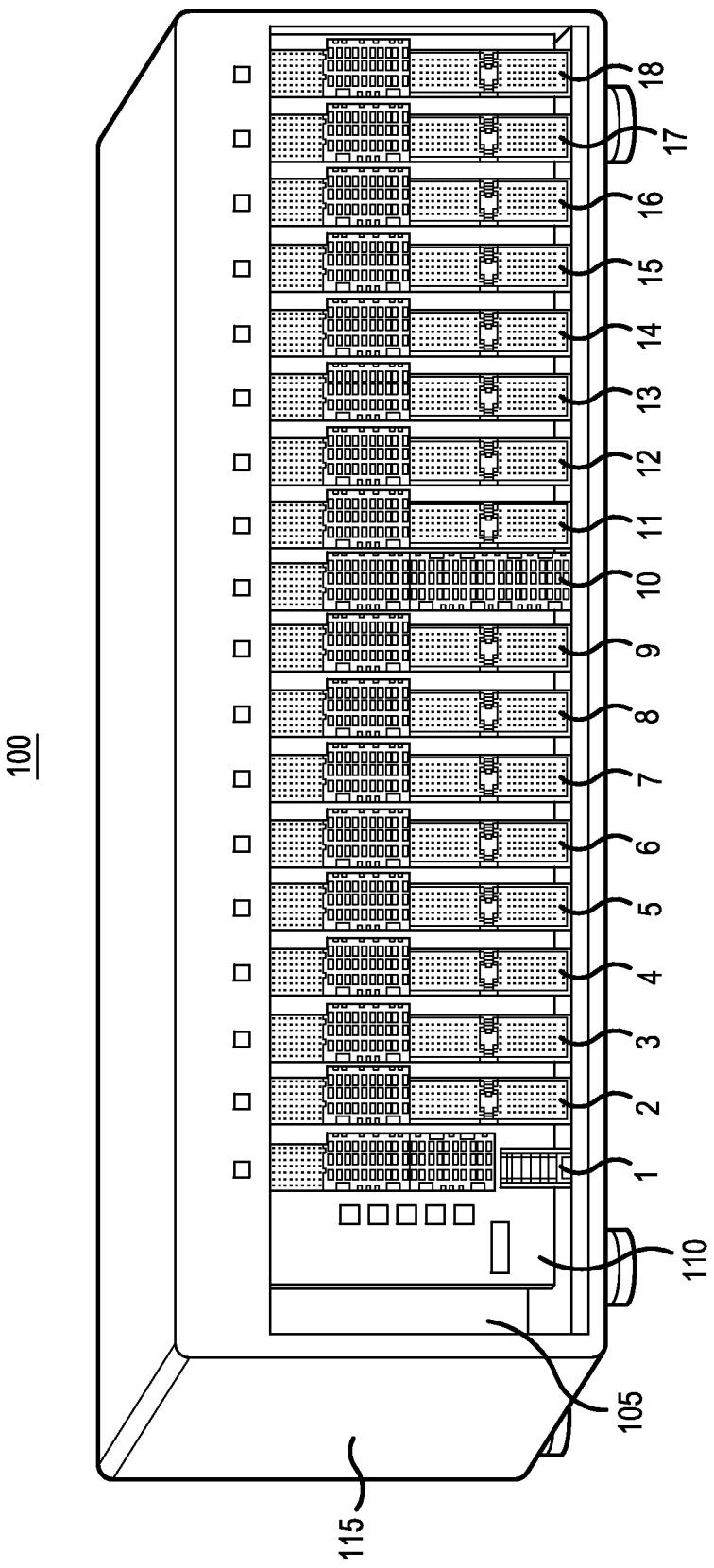
FIG. 1 is a perspective view of a conventional PXI-E chassis.

In the following detailed description, for purposes of explanation and not imitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same Relative terms, such as "above," "below," "top," "bottom," "upper" and "tower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The described embodiments relate generally to PCB technologies, some of which may find application in modular PCI-E based systems such as cPCI-E and PXI-E chassis. Examples of such systems, including example operational details, are described in U.S. patent application Ser. No. 13/191,892 filed Jul. 27, 2011 by Richard, patent application Ser. No. 13/245,176 filed Sep. 26, 2011 b Richard, U.S. patent application Ser. No. 13/247,482 filed Sep. 28, 2011 by Richard, U.S. patent application Ser. No. 13/910,743 filed Jun. 5, 2013 by Richard. The respective disclosures of these patent applications are specifically incorporated herein by reference. It is emphasized that the features described in these patents and patent applications are representative in nature, and alternatives within the purview of one of ordinary skill in the art are contemplated.

In certain embodiments described herein, a backplane Coca cPCI-E or PXI-E chassis comprises a PCB with blind press-fit vias, which extend only partially through the PCB. Because the vias extend only partially through the PCB, a side of the backplane opposite the vias can be used to mount additional components, such as integrated circuits, signal routing lines, etc.

Figure 2:
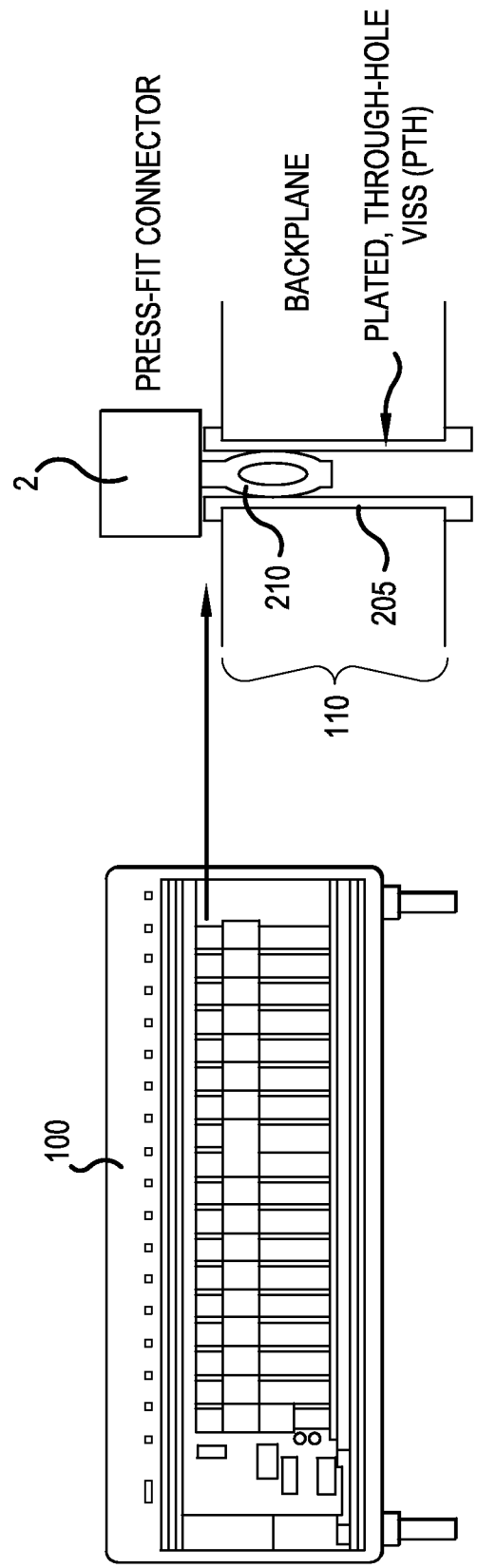
FIG. 2 is a front view of the PXI-E chassis and a cross-sectional view of a connection between a module slot and the PXI-E chassis of FIG. 1.
Figure 3:
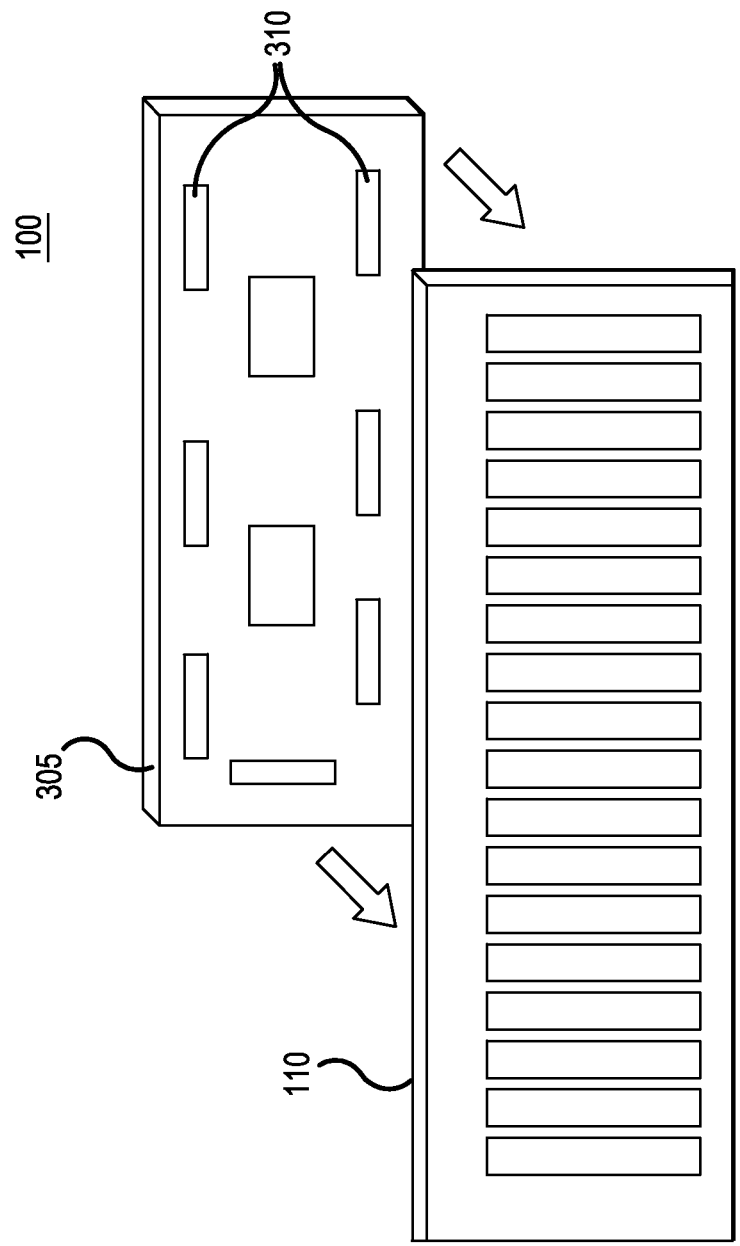
FIG. 3 is a perspective view of the PXI-E chassis of FIG. 1 in combination with a mezzanine board.

The described embodiments may provide various benefits compared to conventional backplane technologies. For example, certain embodiments may provide more efficient use of space compared to conventional backplanes, such as that illustrated in FIG. 2, where THVs 205 penetrate the entire backplane stackup, rendering component placement and signal routing underneath these press-fit connectors limited and close to impossible. Certain embodiments may also provide improved signal integrity, e.g., by avoiding transmission of high speed PCI-E signals across mezzanine connectors (e.g., as in FIG. 3) to reduce impedance discontinuities, inter-symbol interference (ISI), crosstalk, and improve signal eye margins to cater to next generation PCI-E Gen3 and Gen 4 signal rates. Some embodiments may also improve signal integrity through the use of shorter via stub lengths due to blind vias. Certain embodiments may also allow a chassis to be manufactured at lower cost, e.g., by omitting the mezzanine board and board to board connectors, and by lowering inventory and build cost. Certain embodiments may also provide improved airflow by providing a smaller backplane, which can allow chassis fans to run at a lower speed and lower acoustic noise level, or provide higher cooling capability for the ever increasing power requirements of next generation modules.

In the description that follows, various embodiments are described with reference to a PXI-E chassis and backplanes for a PXI-E chassis. However, the described concepts could be adapted to other types of PCI-E compatible chassis such as a CPCI-E chassis or PCI-E based expander chassis. Moreover, certain concepts described with respect to backplanes for a PXI-E chassis could be applied more generally to PCBs or other connection platforms.

Figure 6:
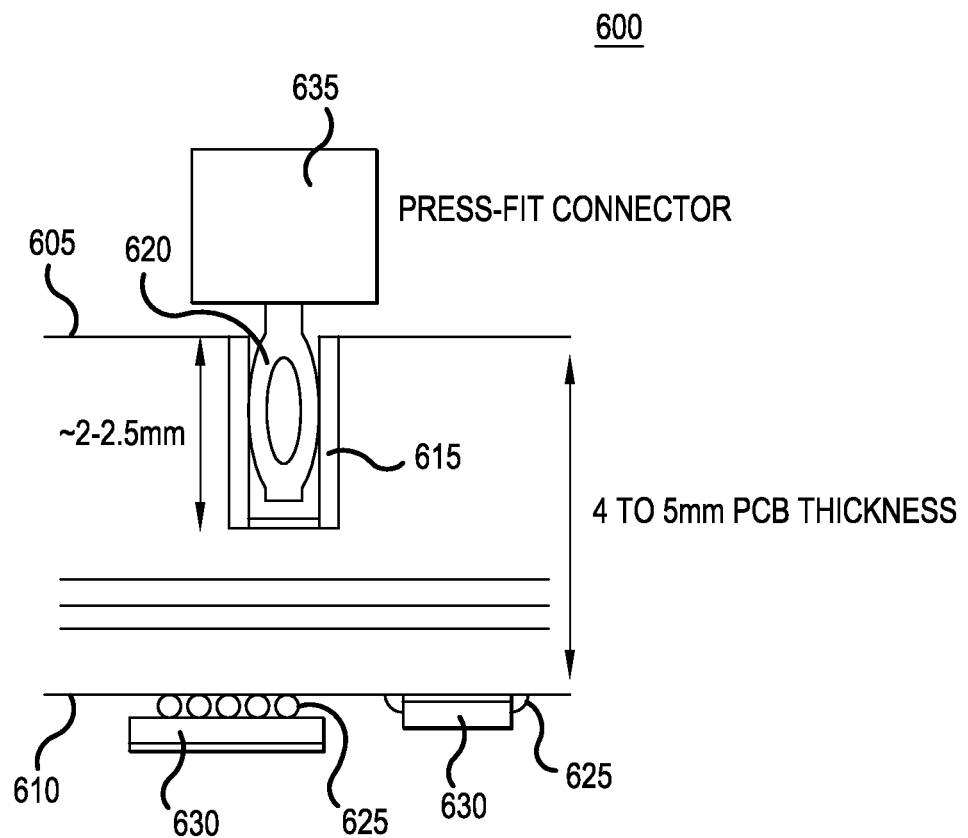
FIG. 6 is a cross-sectional view of an apparatus comprising a PCB according to a representative embodiment.

FIG. 6 is a cross-sectional view of an apparatus 600 comprising a PCB according to a representative embodiment. Apparatus 600 may form part of a chassis such as that illustrated FIG. 1, for example, with the PCB serving as a backplane.

Referring to FIG. 6, apparatus 600 comprises a PCB having a first surface 605 and a second surface 610, at least one blind press-fit via 615 penetrating the first surface and extending partially (e.g., halfway) through the PCB toward second surface 610, and at least one press-fit connector 620 configured to connect a cPCI-E or PXI-E slot 635 to the PCB. Apparatus 600 further comprises electrical connectors 625 disposed in a region of the second surface opposite the at least one blind press-fit via 615 and configured to interface with one or more signal processing components 630 disposed on second surface 610.

Figure 4:
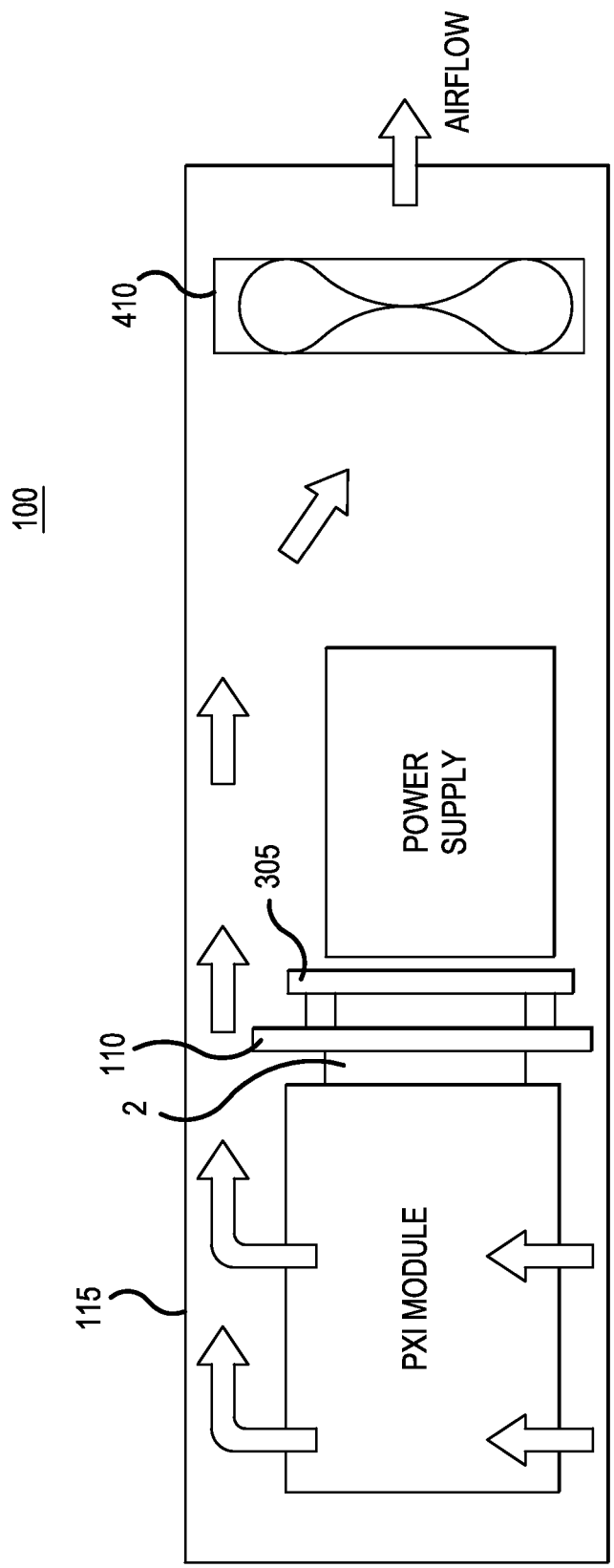
FIG. 4 is a side view of the PXI-E chassis of FIG. 1 in combination with a mezzanine board.
Figure 5:
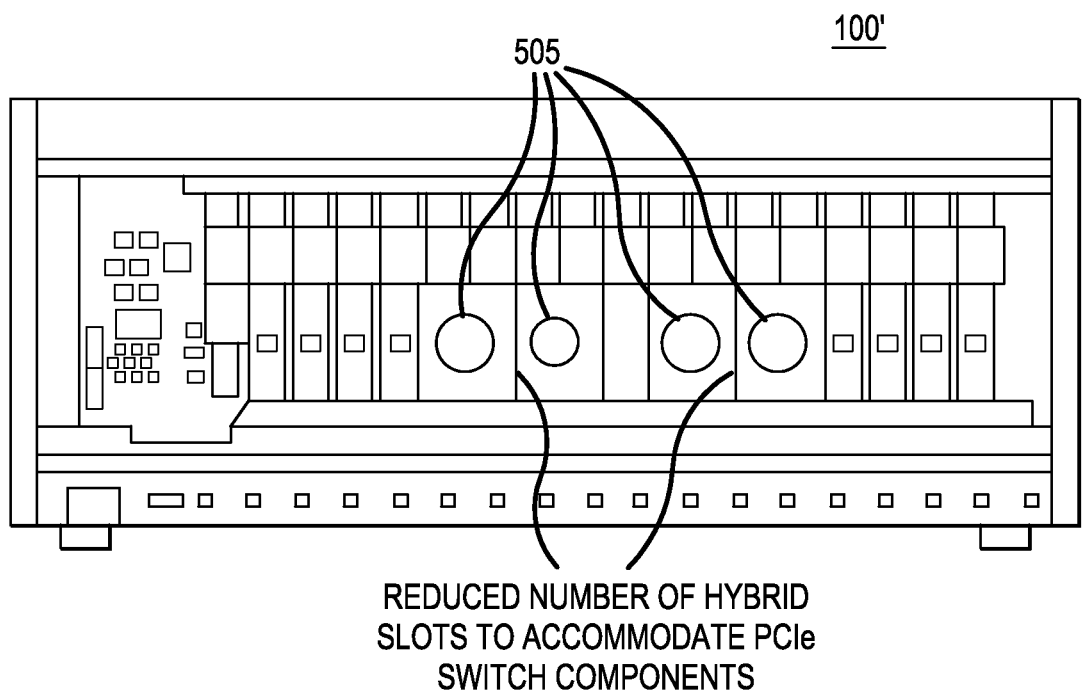
FIG. 5 is a front view of a PXI-E chassis having a reduced number of module slots to accommodate switching components.

In a chassis such as that illustrated in FIG. 1, apparatus 600 may be arranged such that first surface 605 faces outward to allow connection of modules to corresponding slots, while second surface 610 faces inward, e.g., toward an exhaust fan such as that illustrated in FIG. 4. Because the at least one blind press-fit via 615 extends only partially through the PCB and allows connection of components to second surface 610, these features effectively increase the amount of available real-estate on the PCB, avoiding a need to use a mezzanine board or an increase in the size of the PCB. Additionally, the use of shorter length vias results in shorter via stub lengths, which can improve signal integrity.

The PCB may comprise various materials and features known to those skilled in the art, such as one or more dielectric substrate materials, conductive tracks, pads, and integrated electronic components, among other things. These materials and features can be assembled using techniques known to those skilled in the art and having the benefit of this description. The PCB has a thickness of about 4-5 mm in this example, although it is not limited thereto.

Blind press-fit via 615 can be formed using techniques known to those skilled in the art. Some of these techniques may be similar to those used to produce blind press-fit vias in high speed backplane and mid-plane applications, for example, where long through-hate vias create unnecessary stubs which impact signal integrity performance. Although FIG. 6 shows only one blind press-fit via 615, a typical implementation comprises numerous blind press-fit vias for each module slot of a chassis. For example, a blind press-fit via may be included for each pin of each module slot, to allow electrical connection of the pin to a corresponding conductive track or other feature on the PCB. Press-fit connector 620 may be formed to mate with blind press-fit via 615, and may therefore be shorter than a press-fit connector 620 used with a conventional THV.

The cPCI-E or PXI-E slot 635 may be one of several module slots attached to the PCB. For example, a set of hybrid module slots may be attached to the PCB in similar fashion to produce an all-hybrid cPCI-E PXI-E chassis. Moreover, some or all of these slots may be replaced by other types of PCI compatible slots.

Electrical connectors 625 may include any of several known connection technologies or structures, such as pads, conductive tracks, various forms of surface mount technology, and so on. These connectors may be designed to allow connection of specific types of signal processing components 630, such as corresponding ICs or other components. In general, signal processing components 630 may be any type of discrete component that modifies an electrical signal in a designated manner. Such components may include, for instance, PCI-E switch ICs, filters, amplifiers, any many others that will be appreciated by those skilled in the art.

Figure 7:
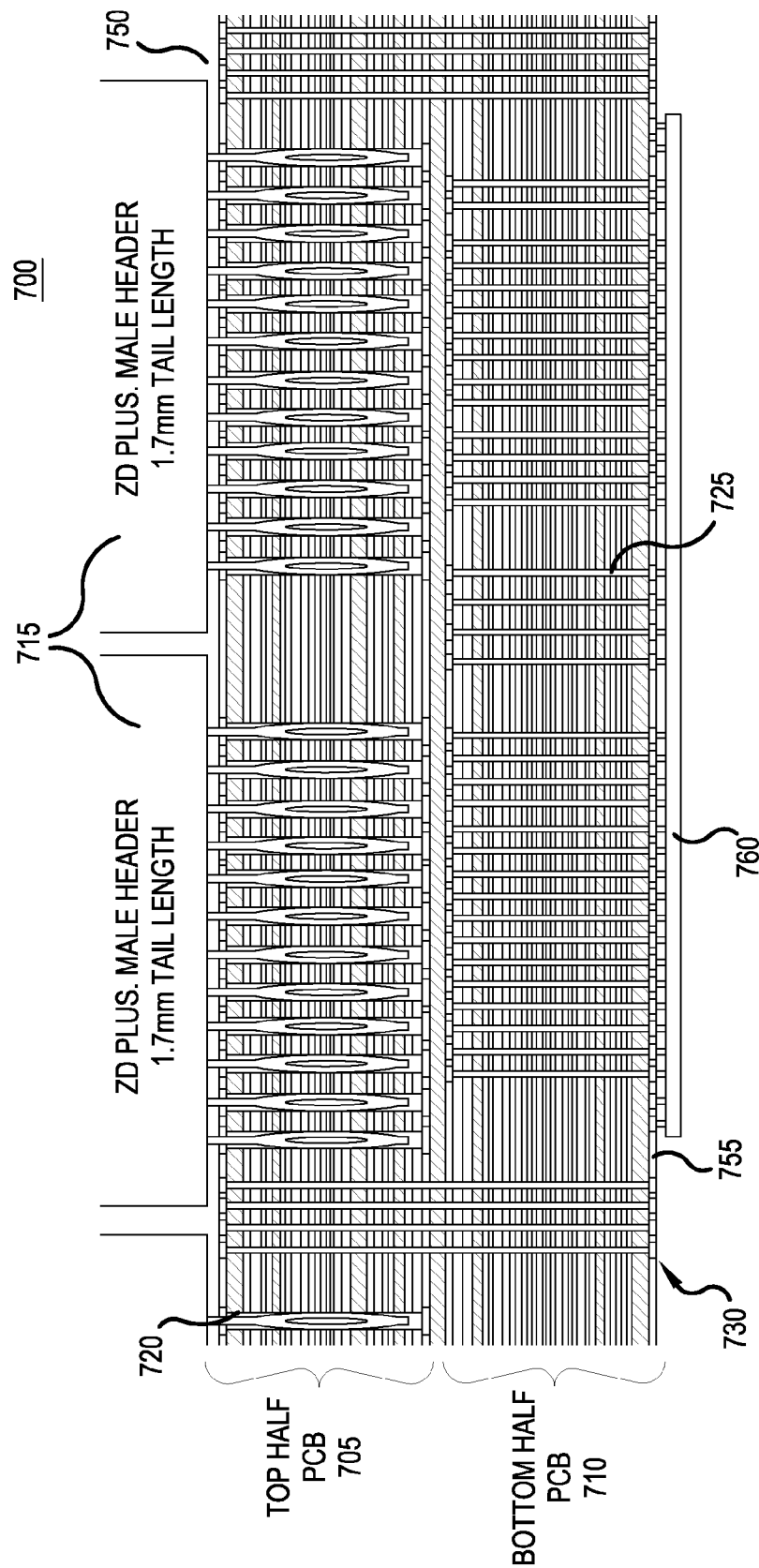
FIG. 7 is a cross-sectional view of an apparatus comprising a PCB according to a representative embodiment.
Figure 8:
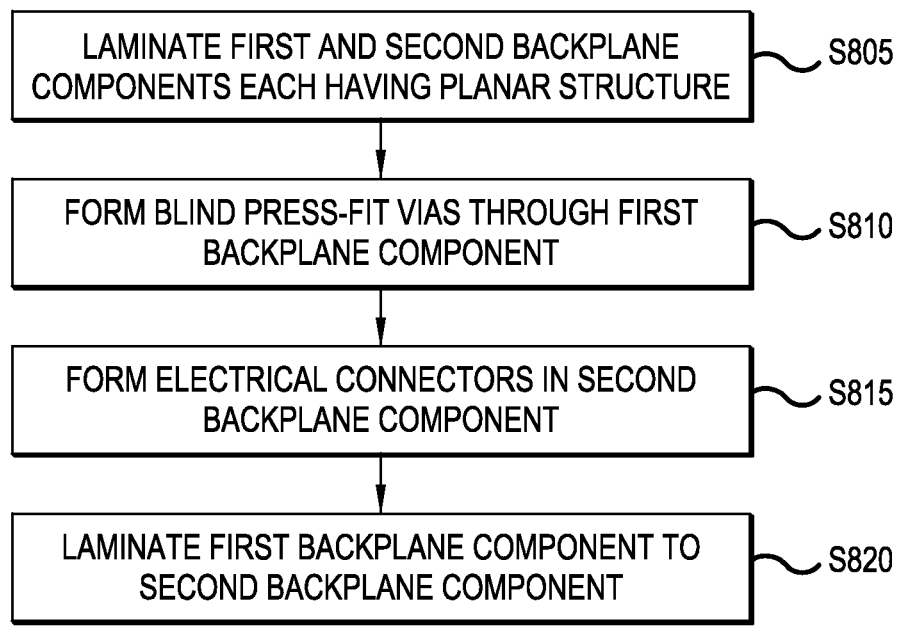
FIG. 8 is a flowchart illustrating a method of manufacturing the apparatus of FIG. 7 according to a representative embodiment.

FIG. 7 is a cross-sectional view of an apparatus 700 comprising a PCB according to a representative embodiment, and FIG. 8 is a flowchart illustrating a method of manufacturing the apparatus of FIG. 7 according to a representative embodiment. The illustrated PCB configuration and method are designed such that a relatively small number of processes are required to produce the PCB, which in turn reduces PCB fabrication cost.

Referring to FIGS. 7 and 8, apparatus 700 comprises a PCB formed by first and second PCB components (or backplane components) 705 and 710 each having a planar structure. In the illustrated example, each of the first and second PCB components 705 and 710 accounts for half of the total thickness of the PCB, although it is not generally limited to these proportions.

Similar to the PCB of FIG. 6, the PCB of FIG. 7 has a first surface 750 through which blind press-fit vias 720 extend partially into the PCB, and a second surface 755 through which electrical connectors 725 (e.g., signal routing tines, pads, etc.) extend partially into the PCB. The PCB further comprises plated through hole vias (and/or electrical connectors) 730 that extend all the way from first surface 750 to second surface 755.

First and second PCB components 705 and 710 are initially formed by laminating them as separate components (S805), drilling plated through hole vias through at least first PCB component 705 (S810), and then forming electrical connectors in at least second PCB component 710 (S815). Thereafter, first and second PCB components 705 and 710 are laminated together to produce the configuration shown in FIG. 7, with the press-fit through hole vias disposed opposite electrical connectors 725 (S820). In this configuration, the press-fit through hole vias form blind press-fit vias 720, since they are exposed on only one side of the conjoined structure.

The formation of blind press-fit vias 720 in the above manner avoids a need to perform relatively expensive controlled-depth drilling to form blind press-fit vias. Moreover, the illustrated PCB structure can be formed with only three lamination cycles, further limiting the cost of manufacture.

After first and second PCB components 705 and 710 are laminated together, plated through hole vias 730 are drilled through the conjoined structure to provide electrical connections between the structures associated with first and second PCB components 705 and 710. In the completed structure illustrated in FIG. 7, signals can be routed on layers directly under blind press-fit vias without concern for drill depth tolerances, thus significantly improving routing flexibility.

Apparatus 700 further comprises slots 715 that are connected to the PCB through blind press-fit vias 720, and one or more signal processing components 760 (e.g., a PCI-E switch IC) attached to electrical connectors 725. These slots and components can be attached to the PCB after all of the other illustrated features are formed.

Figure 9A:
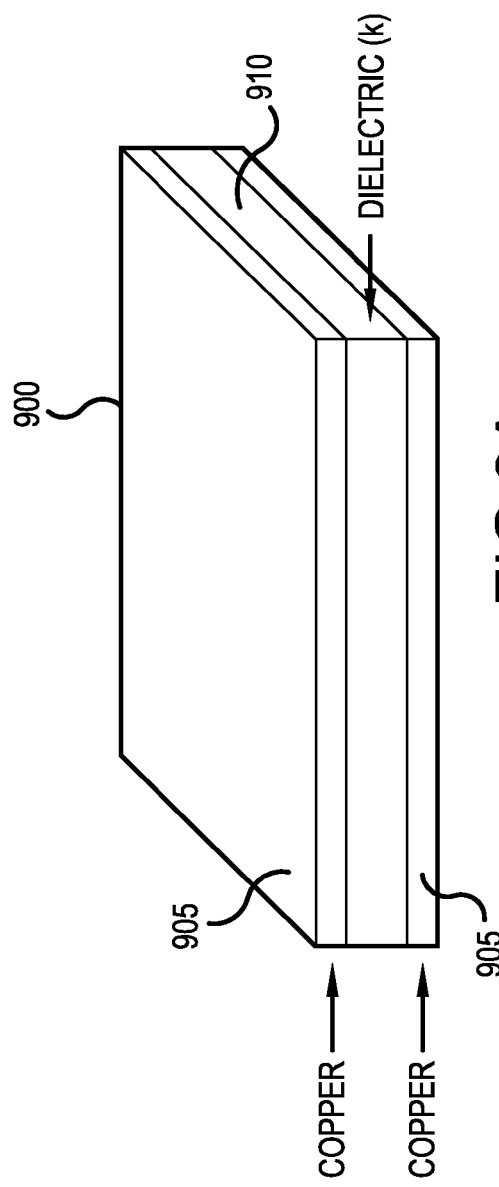
FIG. 9A is a perspective view of an embedded capacitor that may be included in a PCB according to a representative embodiment.
Figure 9B:
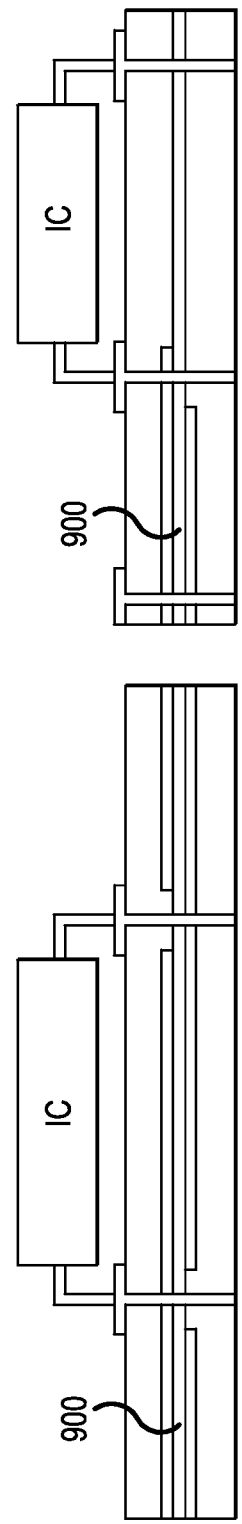
FIG. 9B is a cross-sectional view of an embedded capacitor that may be included in a PCB according to a representative embodiment.

FIGS. 9A and 9B are a perspective view and a cross-sectional view, respectively, of embedded capacitors that may be included in a PCB according to a representative embodiment. These embedded capacitors may be added to the PCB of FIG. 7, for instance.

In general, high speed signal processing components, such as a PCI-E switch IC, require a significant number of bypassing capacitors to ensure low impedance of a power delivery network to their power supply pins. Bypassing capacitors are typically placed as close as possible to the electrical connectors (e.g., balls of a ball grid array) of the signal processing components in order to reduce inductance and improve overall effectiveness of the capacitors. This generally means placing the capacitors directly underneath the components. However, in the PCB of FIG. 7, capacitor placement underneath signal processing, components 760 is not practical due to the press-fit connectors that are directly above them. Accordingly, embedded capacitors such as those illustrated in FIGS. 9A and 9B can be included in apparatus 700 to perform the designated function.

Referring to FIGS. 9A and 9B, an embedded capacitor 900 comprises a thin dielectric laminate 910 disposed between two conductive layers 905. The dielectric laminate 910 and conductive layers 905 can be embedded within adjacent PCB plane layers and connected to corresponding signal processing components (e.g., ICs), as shown in FIG. 9B. These embedded capacitors may provide benefits such as relatively low impedance and relatively high effectiveness in high frequency power supply decoupling.

Figure 10:
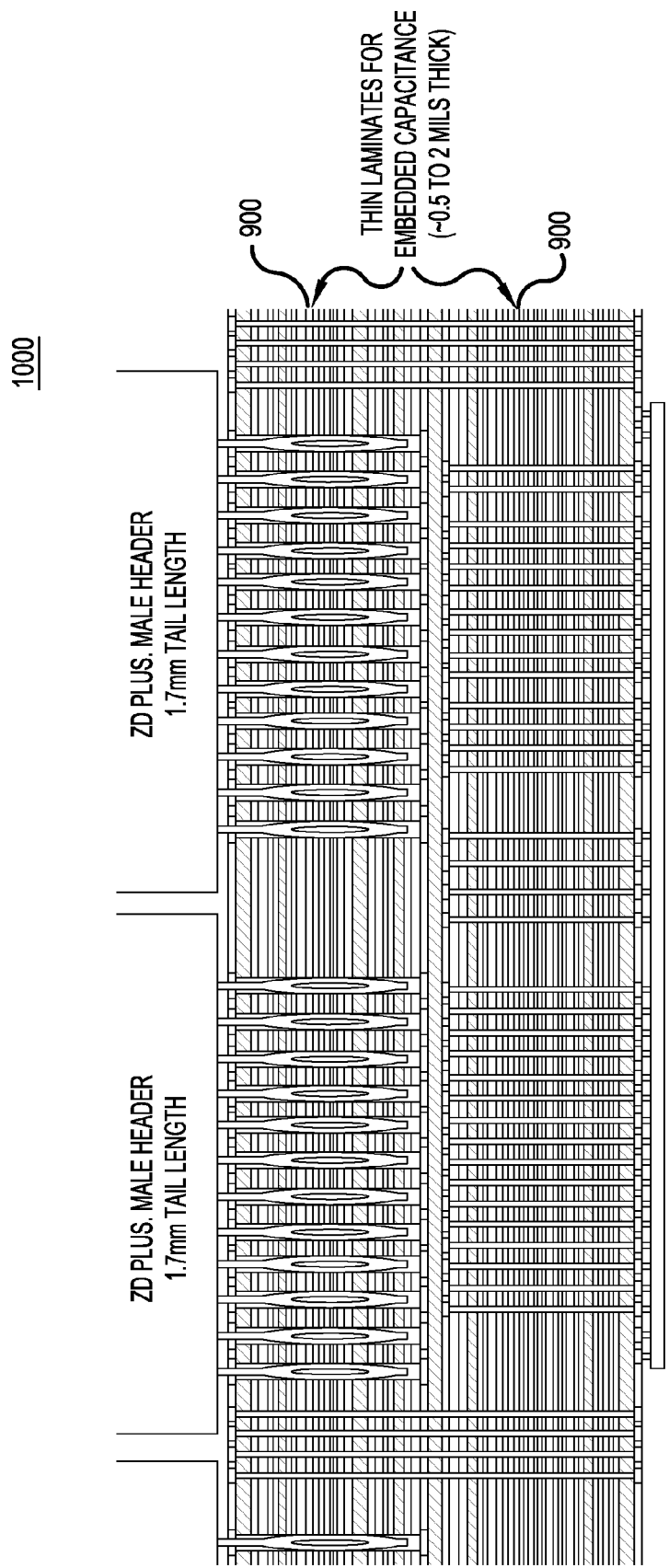
FIG. 10 is a cross-sectional view of an apparatus comprising a PCB according to a representative embodiment.

FIG. 10 is a cross-sectional view of an apparatus comprising a PCB according to a representative embodiment.

Referring to FIG. 10, apparatus 1000 is substantially the same as apparatus 700 of FIG. 7, except that it further comprises embedded capacitors 900 within the PCB. In the illustrated context, embedded capacitors 900 can be formed with thin laminates, e.g., about ~0.5 to 2.0 mm in thickness. By implementing several thin laminate layers on the PCB in this manner, discrete capacitors may be eliminated and replaced by the embedded capacitors as desired.

As indicated by the foregoing, the described embodiments may allow an increase in available board space, elimination of a mezzanine board-to-board connector, and reduction of backplane PCB height. Among other things, these changes may facilitate increased airflow to modules, allowing fans to run at lower speeds and generating less acoustic noise, all while staying within a desired chassis height envelope.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An apparatus, comprising:
    a printed circuit board (PCB) having a first surface and a second surface;
    a plurality of blind press-fit vias penetrating the first surface and extending partially through the PCB toward the second surface, the blind press-fit vias configured to receive press-fit connectors of at least one component to be connected to the PCB, the at least one component comprising a module slot for a compact peripheral component express (cPCI-E) module or a PCI-E eXtensions for instrumentation (PXI-E) module, wherein the PCB forms a backplane compatible with cPCI-E or PXI-E; and
    a plurality of electrical connectors disposed in a region of the second surface opposite the blind press-fit vias and configured to interface with one or more signal processing components disposed on the second surface, wherein the blind press-fit vias are configured to connect at least one hybrid peripheral slot to the backplane, and each of the at least one hybrid slots comprises a 32-bit PCI connector, a PCI-E connector, and a connector for instrument functions such as triggers and clocks.

2. The apparatus of claim 1, wherein the blind press-fit vias define hybrid slots of a full hybrid cPCI-E or PXI-E backplane.

3. The apparatus of claim 1, further comprising a PCI-E switch integrated circuit (IC) disposed on the second surface and connected to the plurality of electrical connectors.

4. The apparatus of claim 1, further comprising:
    a physical support structure incorporating the backplane;
    a plurality of module slots disposed on the backplane and configured to receive PCI-E compatible modules, the module slots comprising at least one system slot, at least one timing slot, and a plurality of peripheral slots; and
    a cavity configured to house and cool an embedded controller connected to the system slot.

5. The apparatus of claim 1, further comprising a plurality of embedded capacitors disposed in the PCB between the electrical connectors and the blind press-fit vias.

6. The apparatus of claim 5, wherein the embedded capacitors comprise thin laminate layers of the PCB.

7. The apparatus of claim 5, wherein the embedded capacitors are configured to provide high speed power decoupling to the one or more signal processing components disposed on the second surface.

8. The apparatus of claim 1, further comprising a plurality of signal routing layers disposed in laminate layers of the PCB between the blind press-fit vias and the electrical connectors.

9. The apparatus of claim 1, further comprising at least one plated through hole via extending from the first surface to the second surface.

10. The apparatus of claim 9, wherein the at least one plated through hole via electrically connects at least one of the blind press-fit vias with at least one of the electrical connectors.

11. The apparatus of claim 1, wherein the PCB comprises a first PCB component incorporating the blind press-fit vias and a second PCB component incorporating the electrical connectors, wherein the blind press-fit vias are formed by creating plated through hole vias in the first PCB component, and thereafter laminating the first PCB component to the second PCB component.

* * * * *